(12) United States Patent
Yoon et al.

(10) Patent No.: US 12,266,907 B2
(45) Date of Patent: Apr. 1, 2025

(54) LASER ELEMENT AND METHOD FOR PRODUCING SAME

(71) Applicant: OE Solutions Co., Ltd., Gwangju (KR)

(72) Inventors: Ki Hong Yoon, Daejeon (KR); Seon Jae Choi, Gumi-si (KR)

(73) Assignee: OE Solutions Co., Ltd., Gwangju (KR)

( * ) Notice: Subject to any disclaimer, the term of this patent is extended or adjusted under 35 U.S.C. 154(b) by 953 days.

(21) Appl. No.: 17/296,522

(22) PCT Filed: Nov. 27, 2018

(86) PCT No.: PCT/KR2018/014667
§ 371 (c)(1),
(2) Date: May 24, 2021

(87) PCT Pub. No.: WO2020/111287
PCT Pub. Date: Jun. 4, 2020

(65) Prior Publication Data
US 2022/0021187 A1    Jan. 20, 2022

(30) Foreign Application Priority Data
Nov. 26, 2018  (KR) .......... 10-2018-0147533

(51) Int. Cl.
*H01S 5/02*    (2006.01)
*H01S 5/042*   (2006.01)
(Continued)

(52) U.S. Cl.
CPC .......... *H01S 5/2031* (2013.01); *H01S 5/0201* (2013.01); *H01S 5/0203* (2013.01);
(Continued)

(58) Field of Classification Search
CPC .... H01S 5/2031; H01S 5/0201; H01S 5/0203; H01S 5/04256; H01S 5/1064; H01S 5/2275
See application file for complete search history.

(56) References Cited

U.S. PATENT DOCUMENTS

| | | | |
|---|---|---|---|
| 2009/0053838 A1* | 2/2009 | Kashima | H01S 5/4025 438/26 |
| 2009/0296765 A1* | 12/2009 | Takayama | H01S 5/22 372/45.01 |
| 2016/0300979 A1 | 10/2016 | Oh et al. | |

FOREIGN PATENT DOCUMENTS

| | | |
|---|---|---|
| KR | 10-2006-0131691 | 12/2006 |
| KR | 10-0670831 | 1/2007 |

(Continued)

OTHER PUBLICATIONS

Written Opinion of International Search Report dated Aug. 26, 2019 in PCT/KR2018/014667, pp. 4.

(Continued)

*Primary Examiner* — Yuanda Zhang
(74) *Attorney, Agent, or Firm* — Ichthus International Law PLLC

(57) ABSTRACT

Provided are a laser element and a method for manufacturing the same, in which the laser element includes a first clad layer, an optical waveguide disposed on the first clad layer, a second clad layer disposed on the optical waveguide, a first electrode disposed on the second clad layer, and a dummy clad disposed on the optical waveguide and apart from the second clad layer and the first electrode.

16 Claims, 17 Drawing Sheets

(51) Int. Cl.
- *H01S 5/10* (2021.01)
- *H01S 5/20* (2006.01)
- *H01S 5/227* (2006.01)

(52) U.S. Cl.
CPC ........ *H01S 5/04256* (2019.08); *H01S 5/1064* (2013.01); *H01S 5/2275* (2013.01)

(56) References Cited

FOREIGN PATENT DOCUMENTS

| | | |
|---|---|---|
| KR | 10-2009-0080486 | 7/2009 |
| KR | 10-2016-0150247 | 12/2016 |

OTHER PUBLICATIONS

International Search Report dated Aug. 26, 2019 in PCT/KR2018/014667, pp. 4.

\* cited by examiner

[FIG. 1]
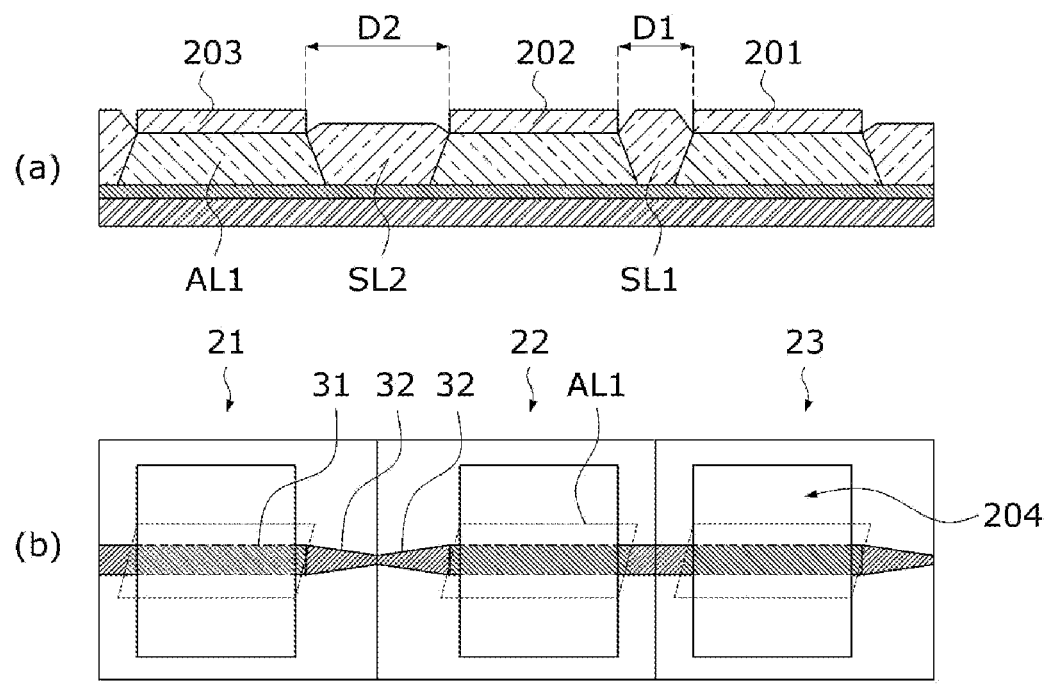
[FIG. 2A]
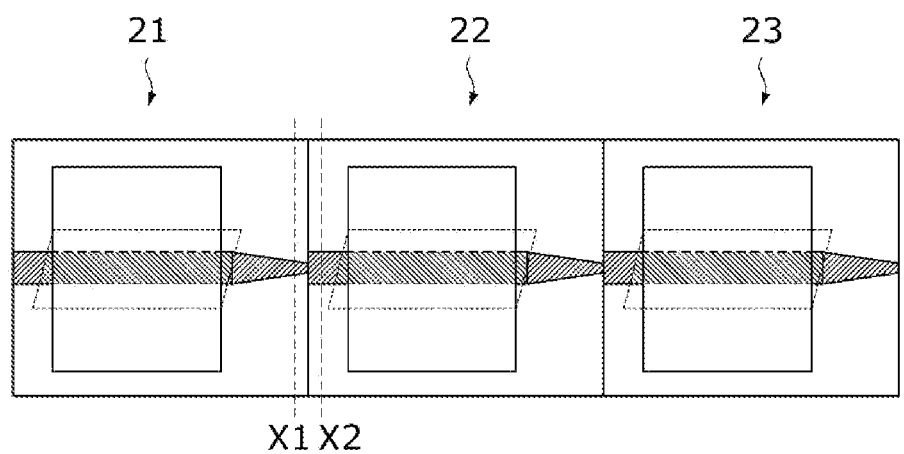

[FIG. 2B]
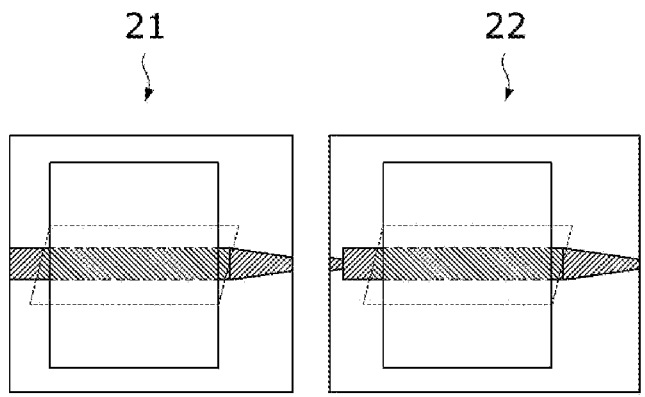
[FIG. 2C]
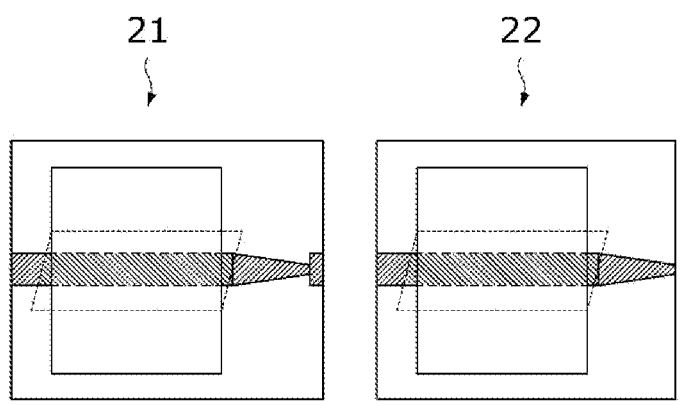
[FIG. 3]
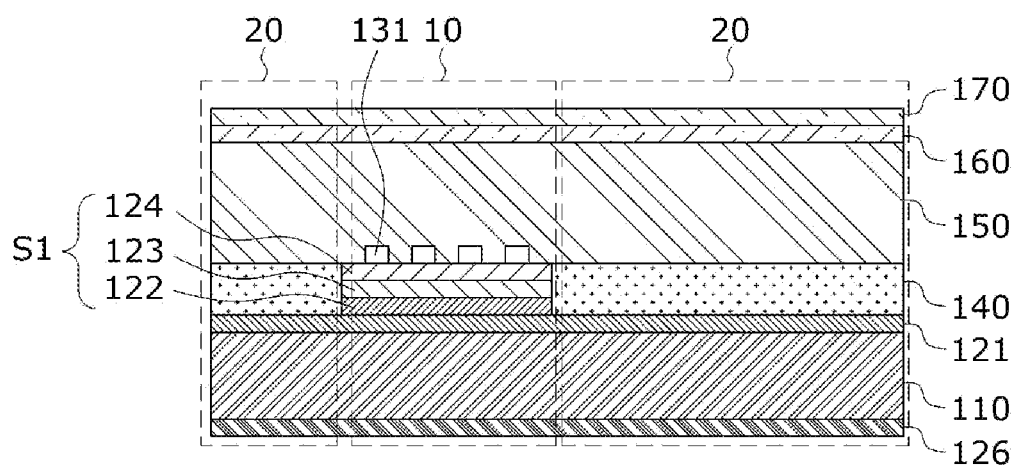

[FIG. 4]
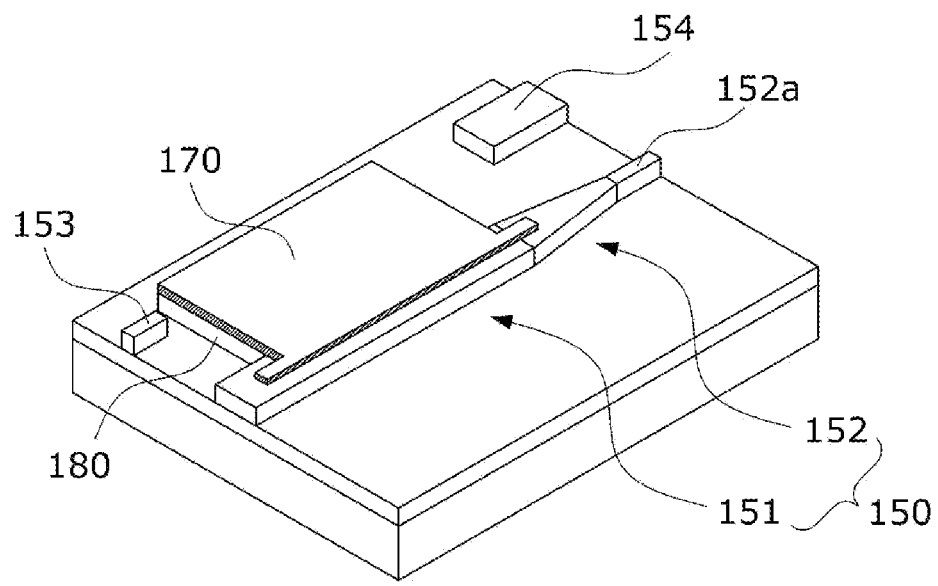
[FIG. 5]
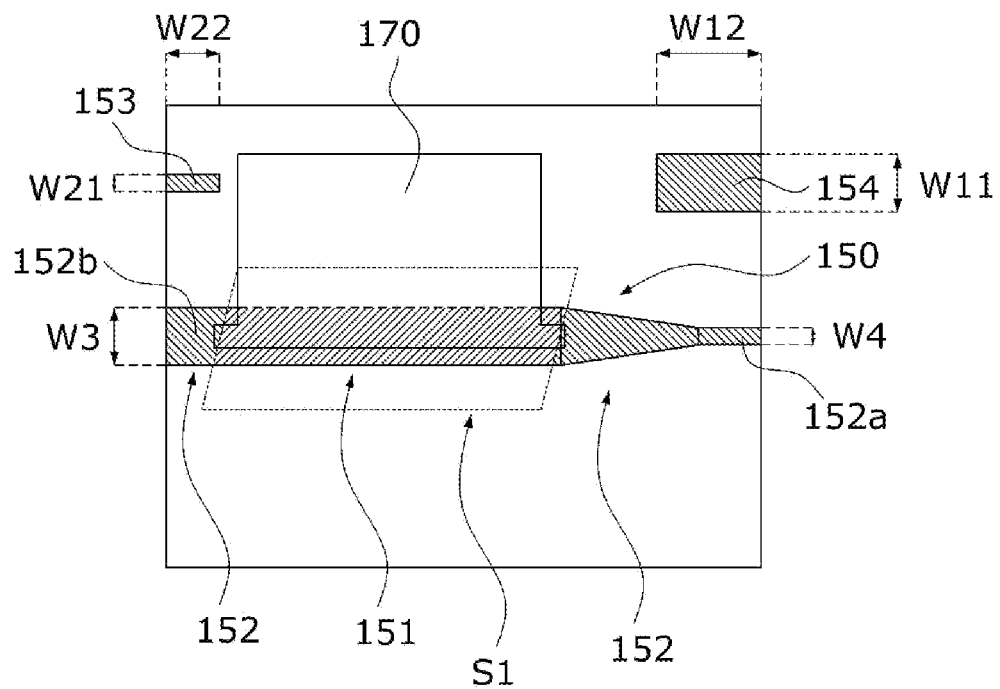

【FIG. 6】
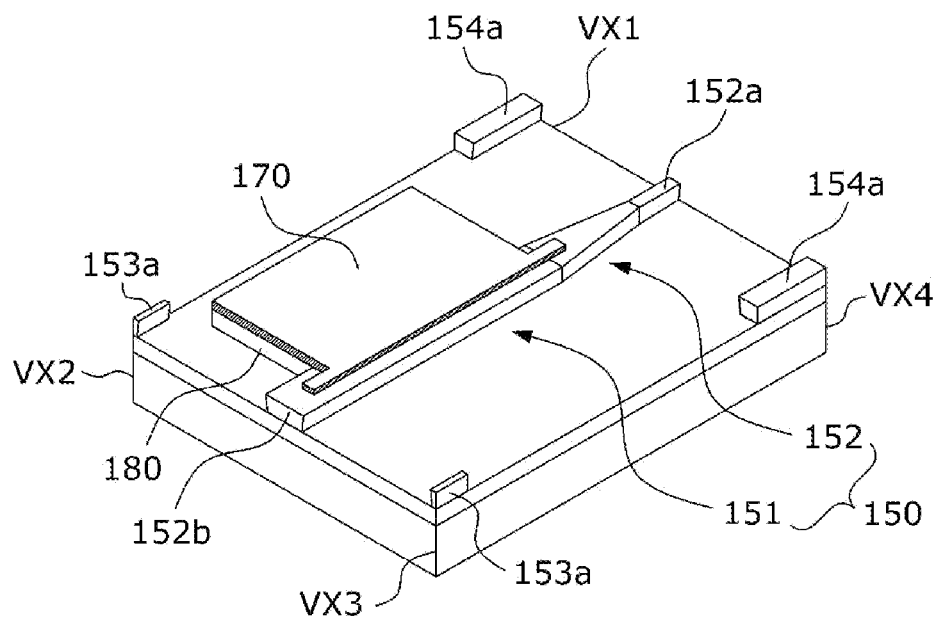
【FIG. 7】
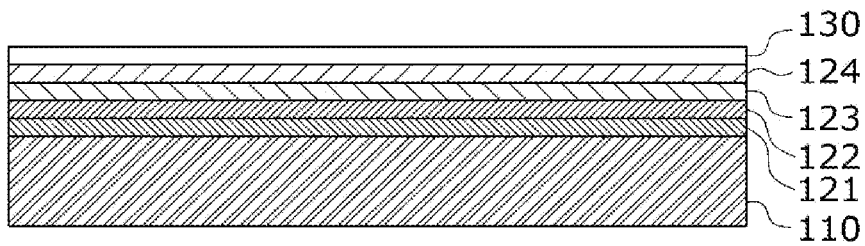

[FIG. 8]
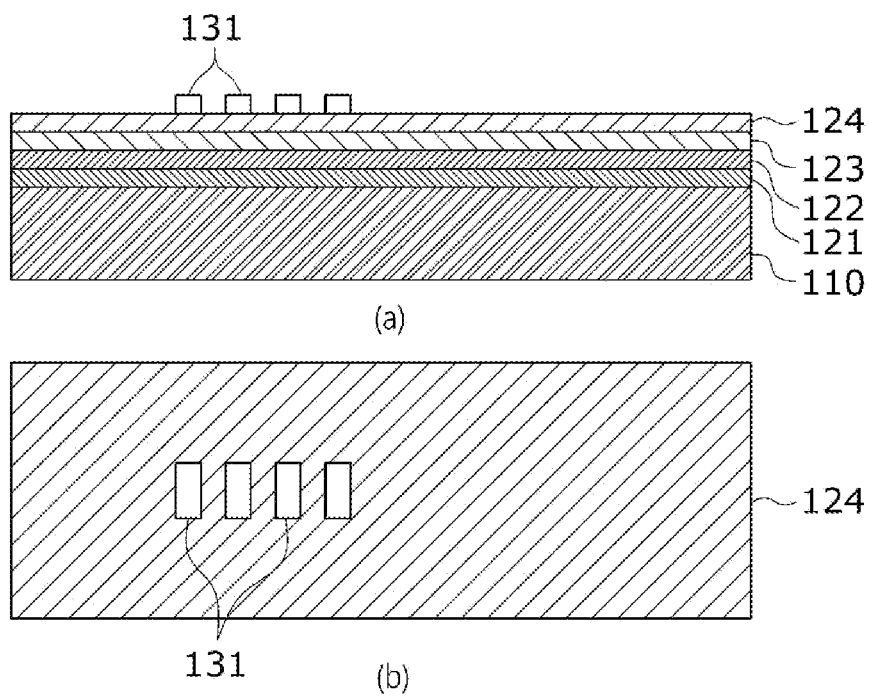
[FIG. 9]
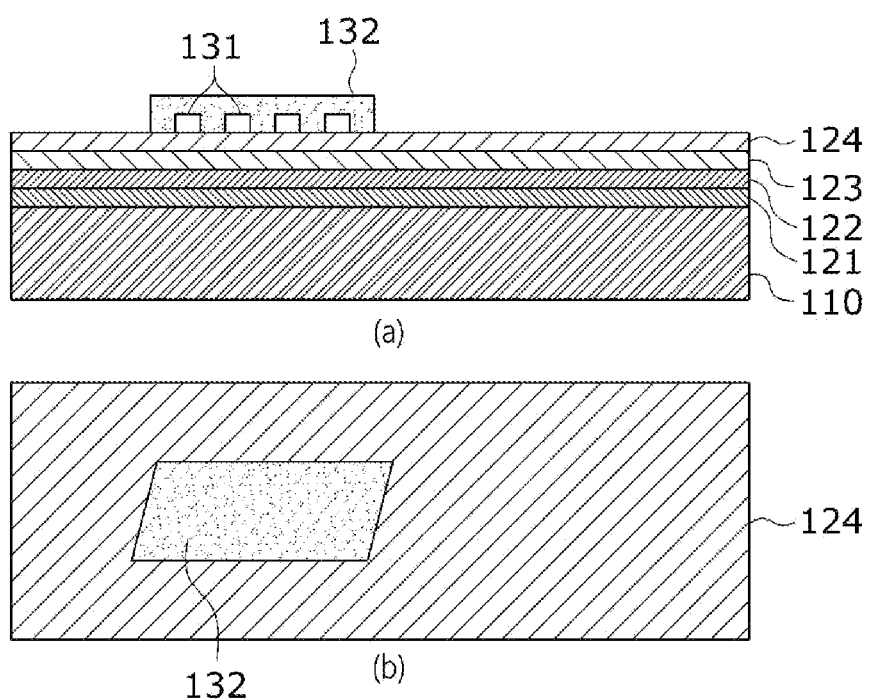

[FIG. 10]
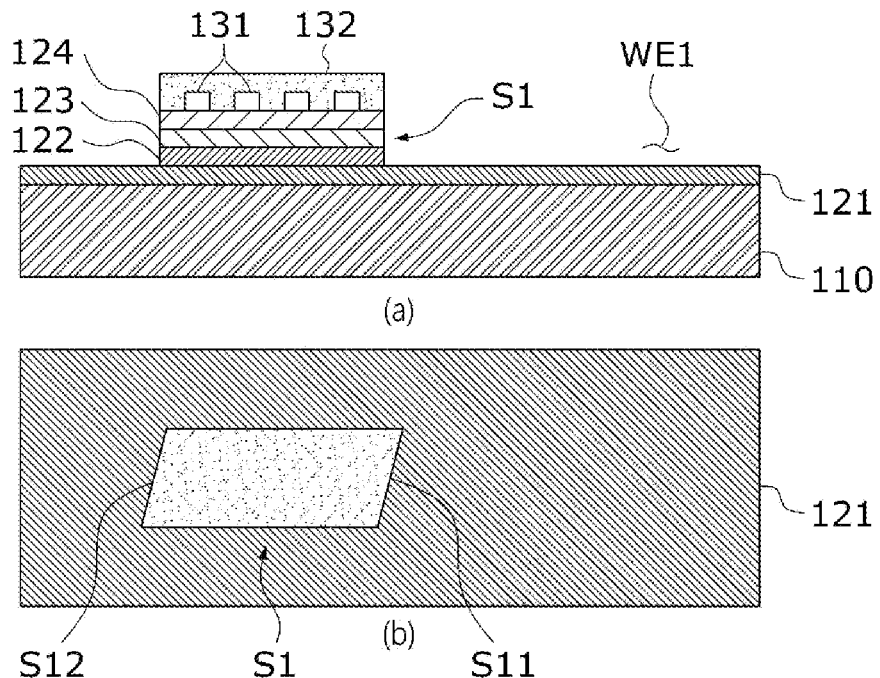
[FIG. 11]
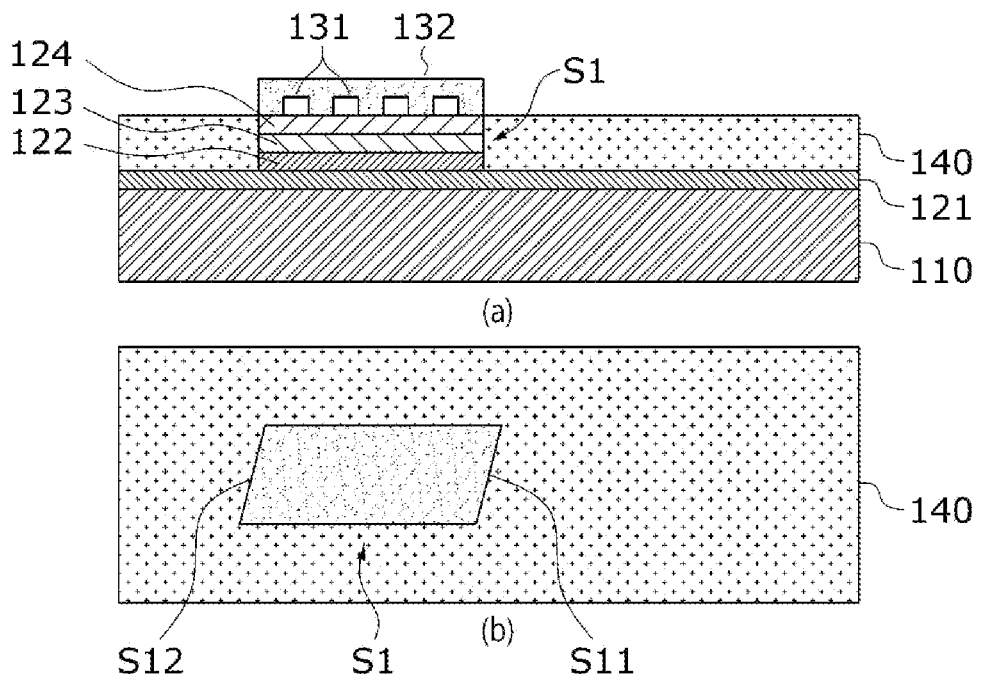

[FIG. 12]
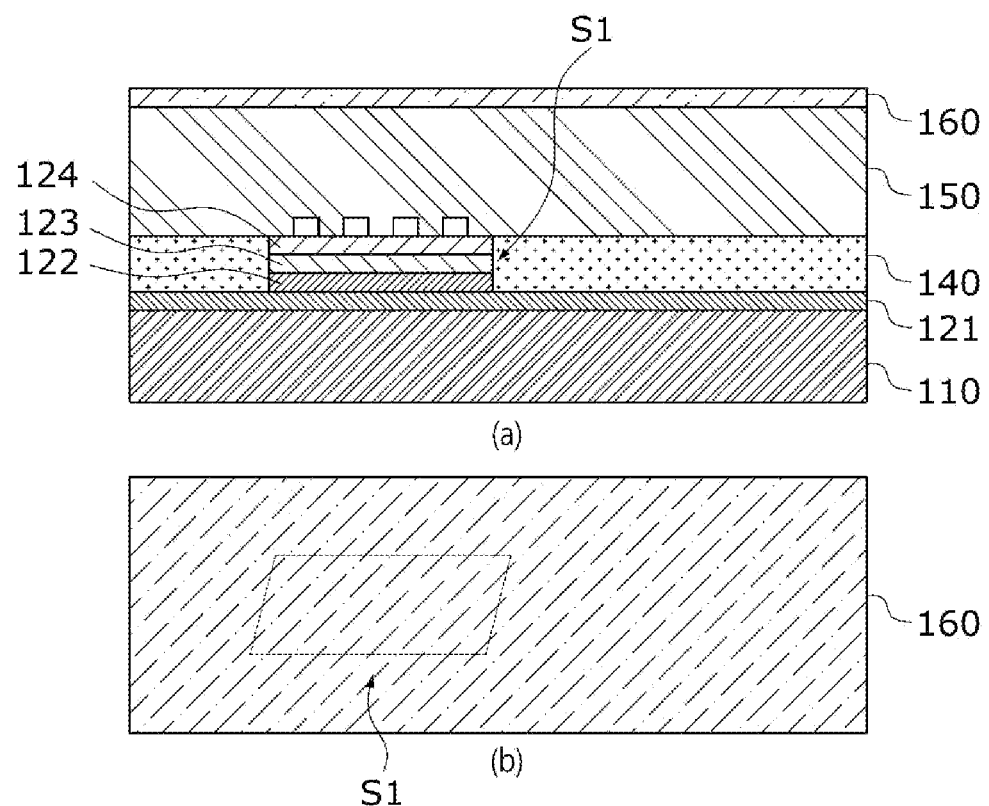

[FIG. 13]
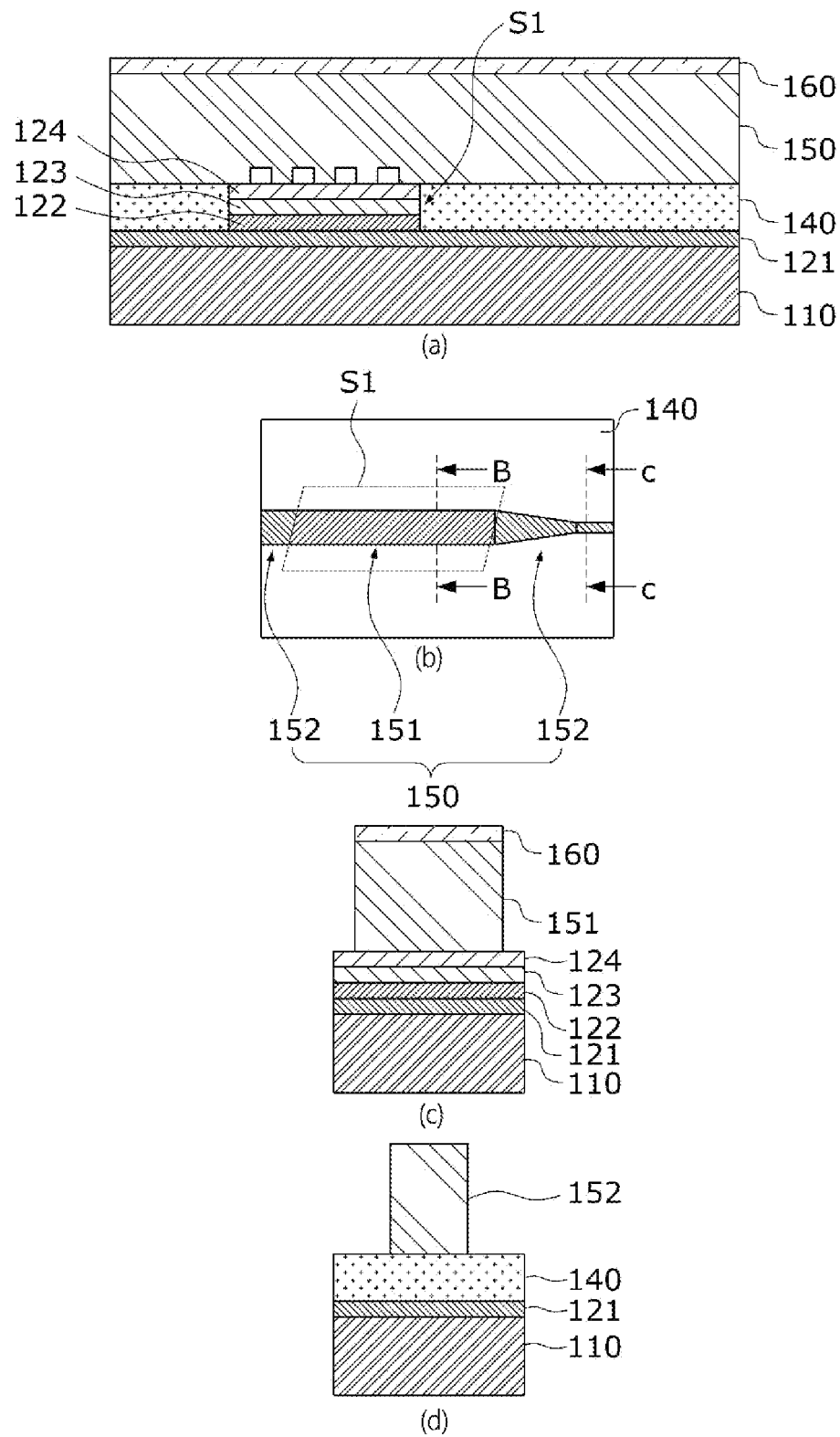

[FIG. 14]
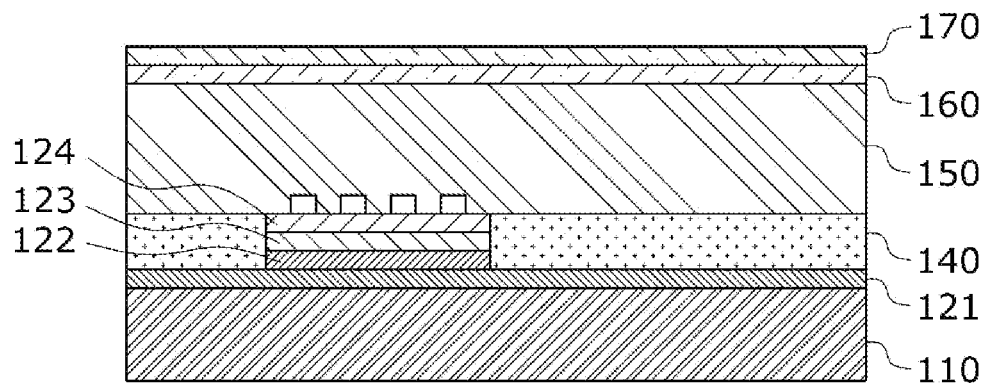
[FIG. 15]
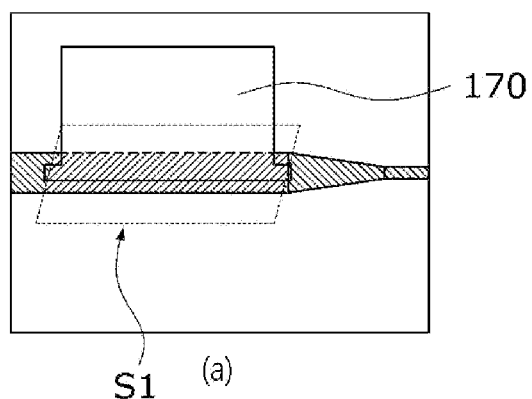
(a)
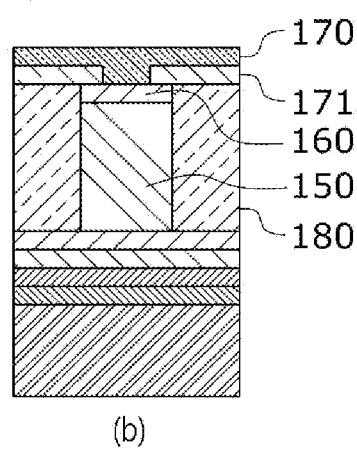
(b)

[FIG. 16]
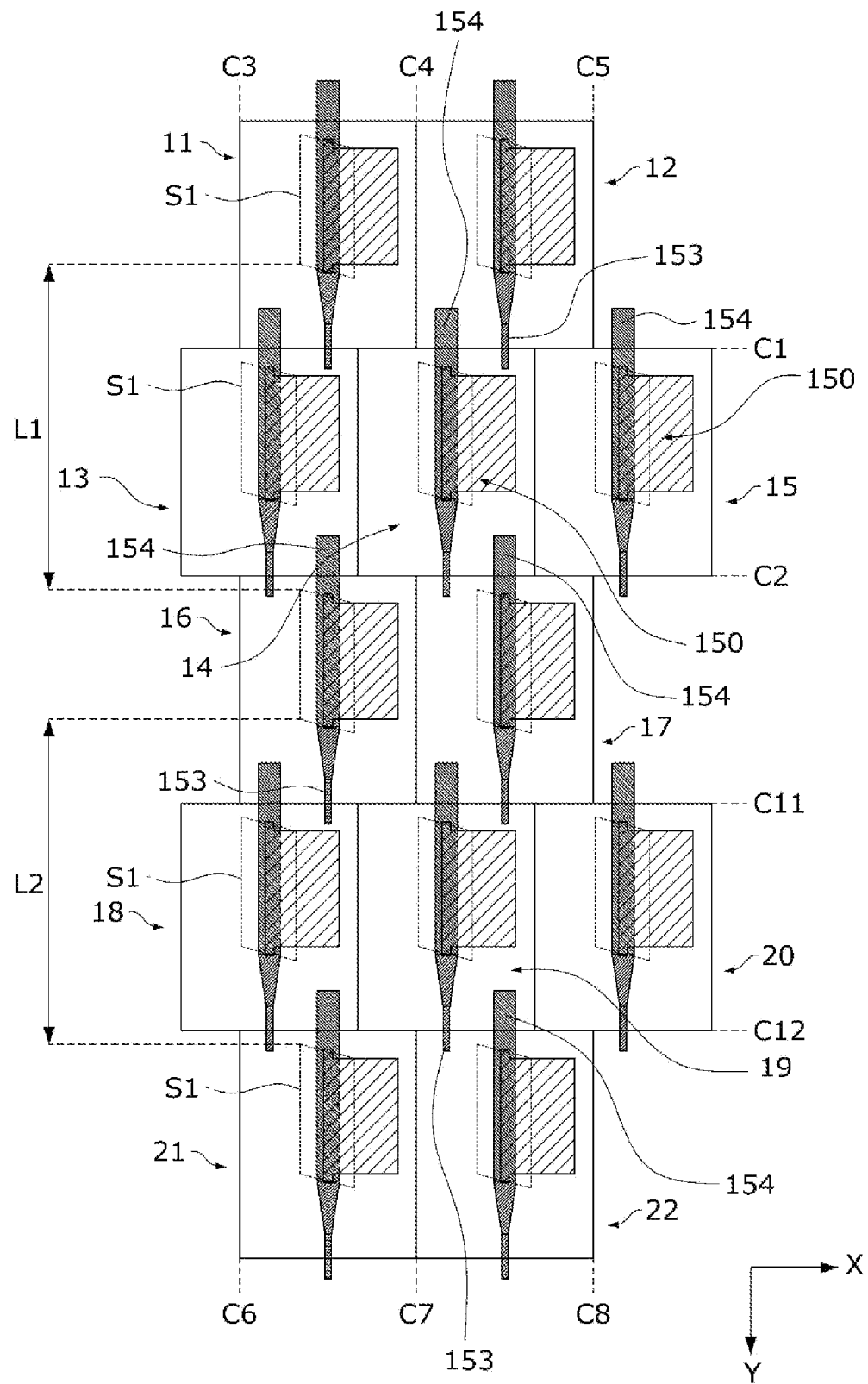

[FIG. 17]
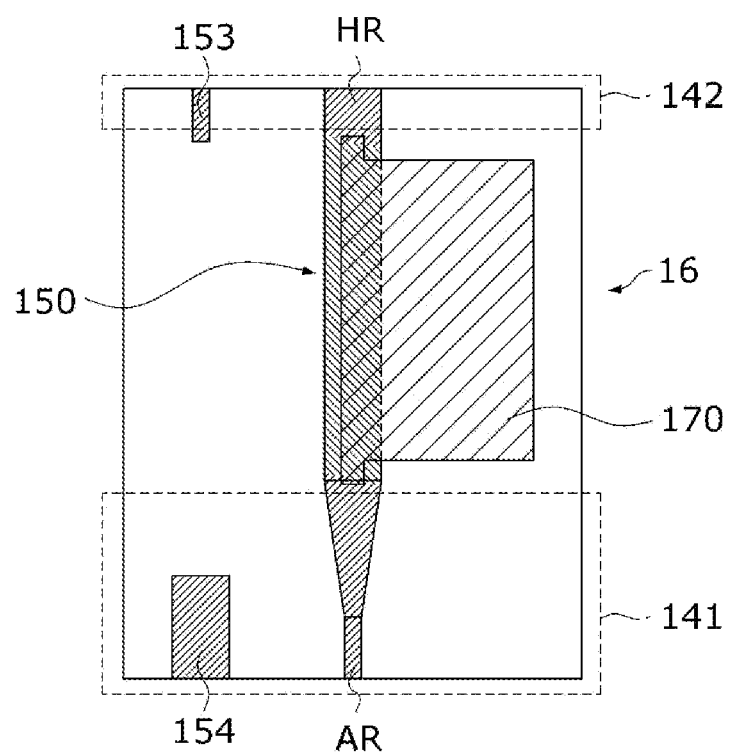

[FIG. 18]
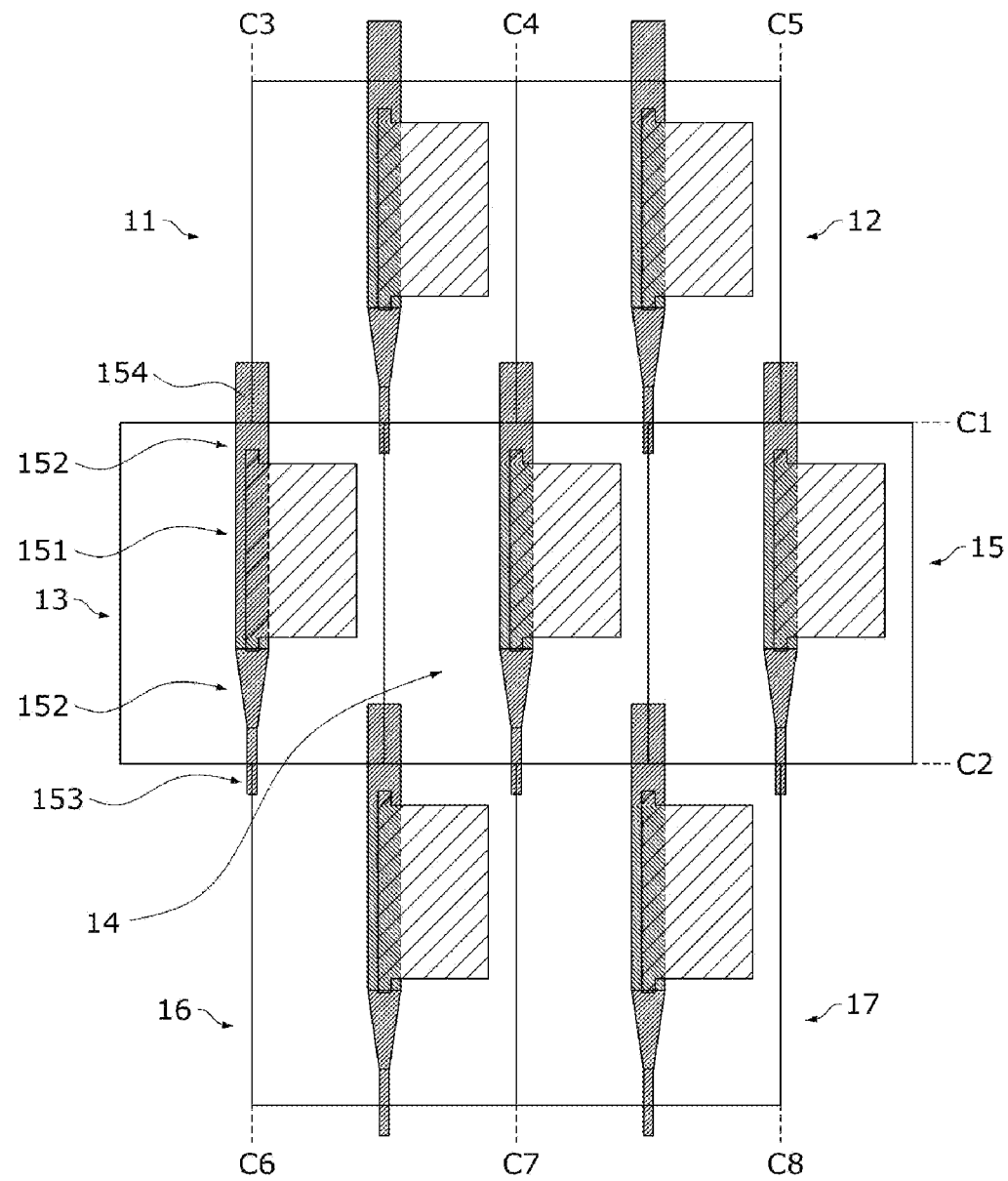

[FIG. 19]
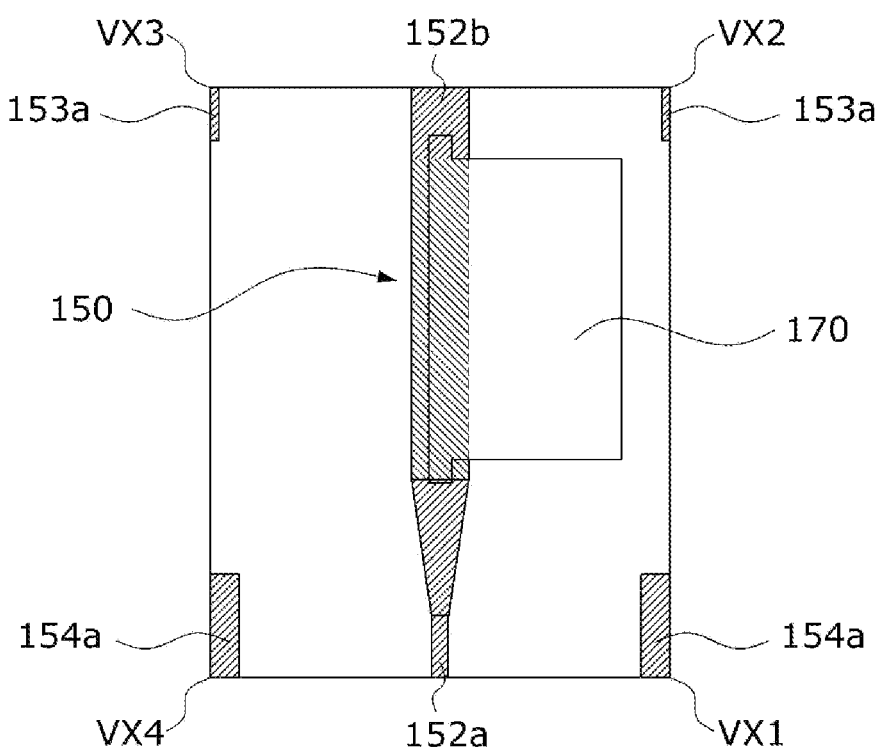

[FIG. 20]
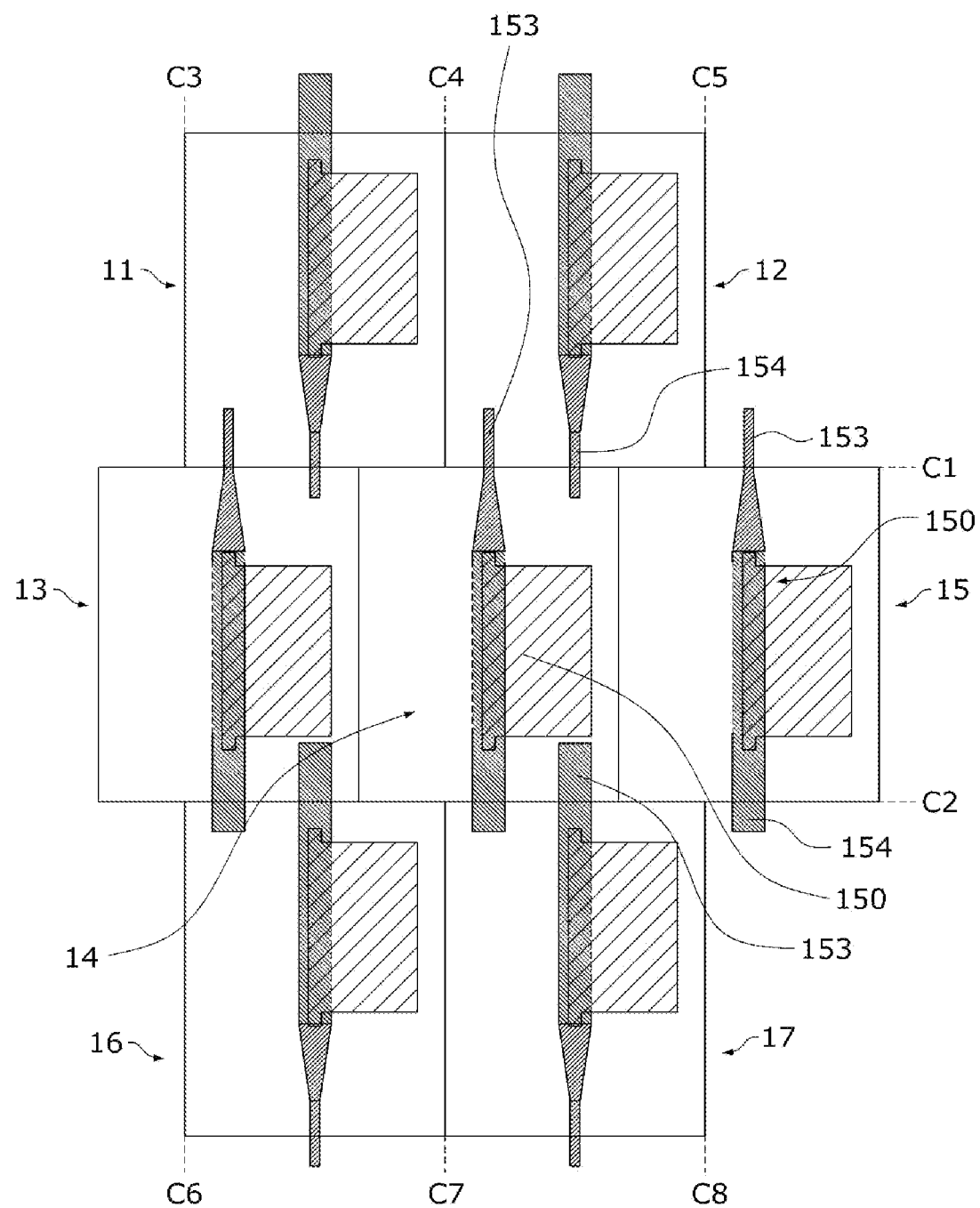

[FIG. 21]
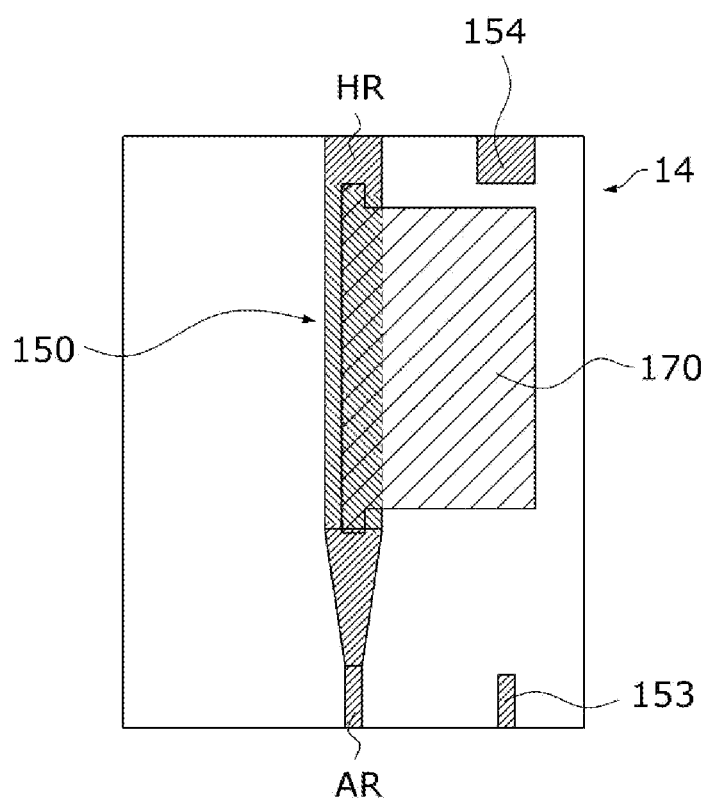

【FIG. 22】
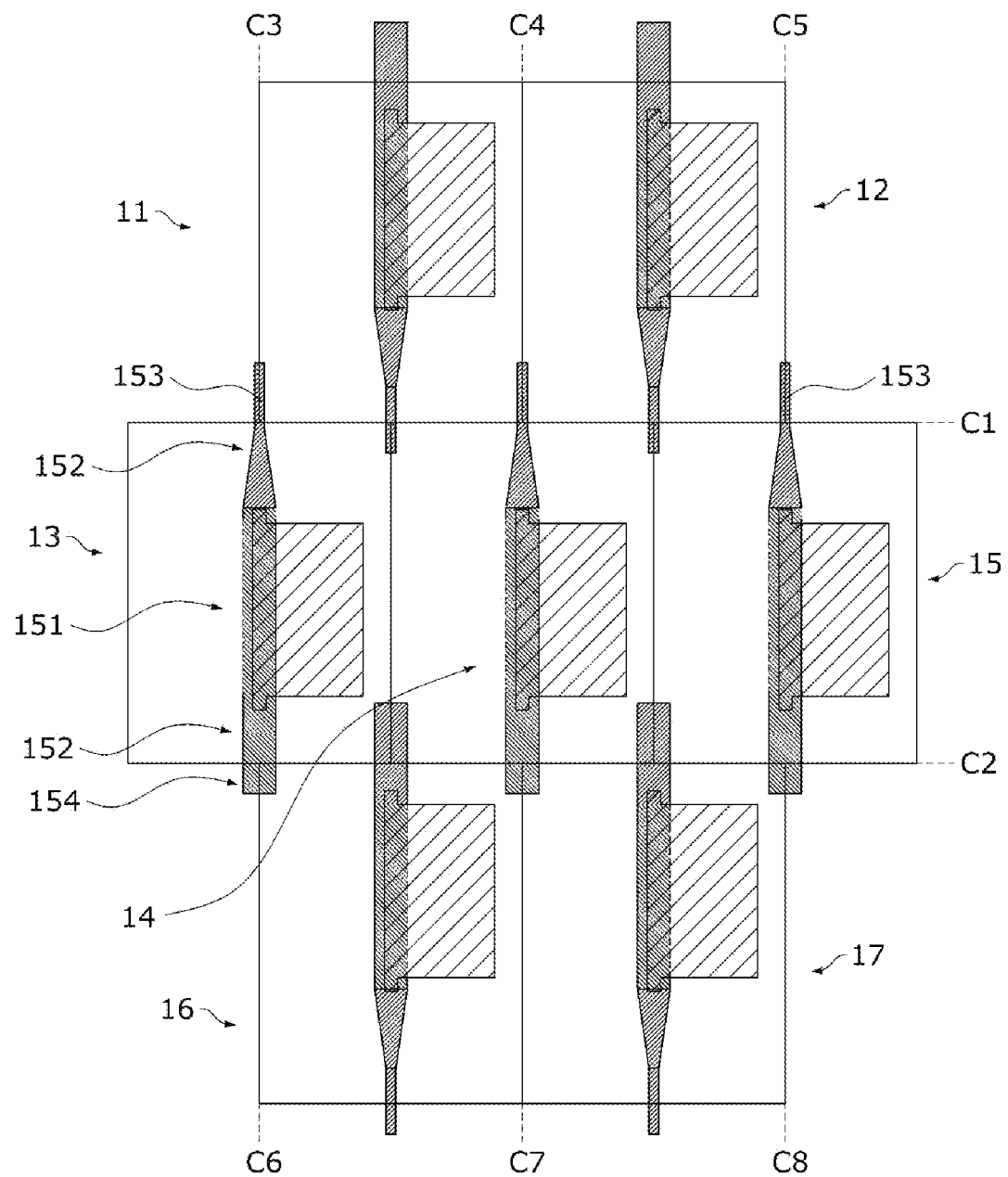

[FIG. 23]
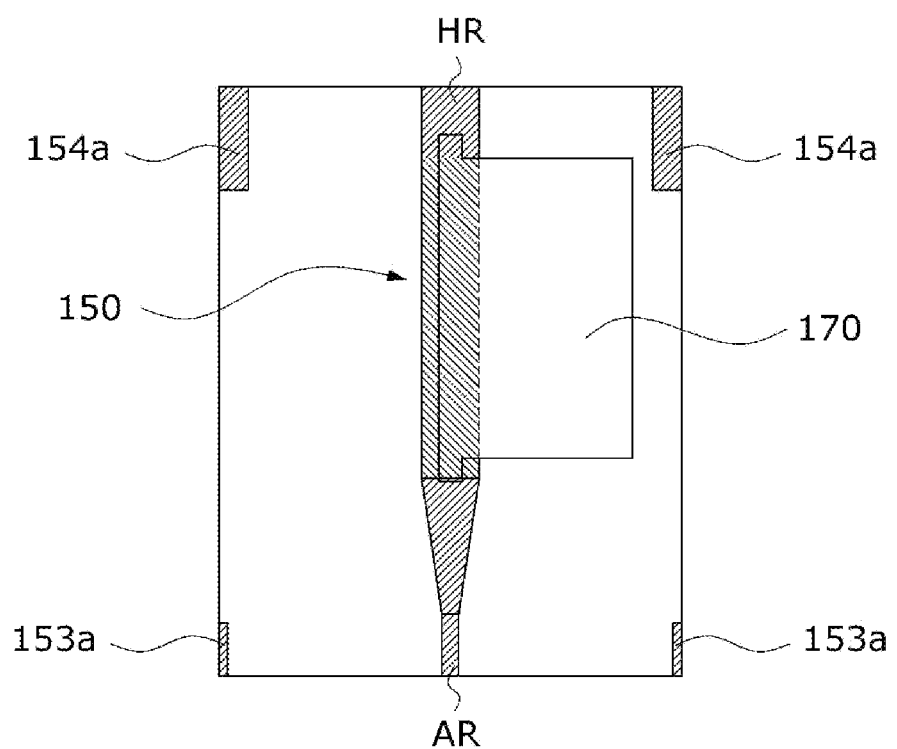

LASER ELEMENT AND METHOD FOR PRODUCING SAME

TECHNICAL FIELD

An embodiment relates to a laser element and a method for manufacturing the same.

BACKGROUND ART

An optical transceiver used in optical communication is optically coupled with an optical fiber. To produce economical optical transceivers, a waveguide and an optical fiber, which transmit signals in an optical element, need to be losslessly coupled with each other at a minimal cost. This is because higher coupling efficiency leads to economic feasibility.

For mode match between a laser diode and an optical fiber, a mode size converter (a spot size converter (SSC)) may be included. For the mode match between the laser diode and the optical fiber, a near-field pattern (NFP) of the laser diode has to be large and a far-field pattern (FFP), which is a diffracted pattern of the NFP, has to be small. The laser diode having the SSC may obtain the mode match between the laser diode and the optical fiber, by reducing the FFP.

In addition, when an active region and a passive region are monolithically integrated in one element, the passive region has a different material composition to execute a function such as amplification, optical modulation, etc. For coupling between these regions, a butt-joint structure may be used.

Referring to (a) of FIG. 1, for a conventional laser element, after an active waveguide AL1 is formed, the active waveguide AL1 is partially etched using a mask 201 and passive waveguides SL1 and SL2 are regrown. The passive waveguides SL1 and SL2 are regrown in regions other than masks 201, 202, and 203, without being grown on the masks 201, 202, and 203. Thereafter, as shown in (b) of FIG. 1, an upper clad layer 31 is etched to form an SSC structure 32 on which an electrode 204 is formed. Then, each chip-unit region is cut to manufacture a plurality of laser diodes 21, 22, and 23.

However, when the SSC structures 32 of the chip-unit regions face each other, the passive waveguides SL1 and SL2 have different thicknesses and compositions.

For example, the area of a first region D1 between the first mask 201 and the second mask 202 is small, and thus regrowth is relatively fast therein, whereas the area of a second region D2 between the second mask 202 and the third mask 203 is large, and thus regrowth is relatively slow therein. Consequently, regrowth thicknesses of the first region D1 and the second region D2 are different from each other. Moreover, due to a selective area growth (SAG) effect, compositions of the first region D1 and the second region D2 become different from each other. As a result, a qualitative difference of a passivation material occurs, such that the amount of absorption of reflected light based on a refractive index differs, resulting in a quality failure of an element.

In addition, as shown in FIG. 2A, when an SSC structure is formed for each chip-unit region, a width of an upper clad layer sharply changes with a cutting position of a chip, reducing a yield.

As shown in FIG. 2B, when cutting is performed at a position X1 due to a process margin, an upper clad layer of a second laser diode 22 undergoes a sharp width change, making it unavailable.

As shown in FIG. 2C, when cutting is performed at a position X2, an upper clad layer of a first laser diode 21 undergoes a sharp width change, making the first laser diode 21 unavailable.

DETAILED DESCRIPTION OF THE INVENTION

Technical Problem

Provided are a laser element and a method for manufacturing the same, in which uniformity in regrowth thickness and composition of a passive optical waveguide may be improved.

Also provided are a laser element and a method for manufacturing the same, in which a yield may be maintained in spite of a process error at a cutting position of a chip.

Problems to be solved in embodiments are not limited thereto, and include objects or effects that may be understood from solutions to the problems or embodiments described below.

Technical Solution

According to an aspect of the present disclosure, a laser element includes a first clad layer, an optical waveguide disposed on the first clad layer, a second clad layer disposed on the optical waveguide, a first electrode disposed on the second clad layer, and a dummy clad disposed on the optical waveguide and apart from the second clad layer and the first electrode.

The dummy clad may include a first dummy clad and a second dummy clad, and an area of the first dummy clad may be larger than an area of the second dummy clad.

A thickness of the second clad layer, a thickness of the first dummy clad, and a thickness of the second dummy clad may be equal to one another.

A length of the first dummy clad may be equal to a length of the second dummy clad.

The first electrode may be disposed between the first dummy clad and the second dummy clad.

Compositions of the first dummy clad and the second dummy clad may be the same as a composition of the second clad layer.

The first dummy clad may be equal to a maximum width of the second clad layer, and the second dummy clad may be equal to a minimum width of the second clad layer.

The dummy clad may include a first dummy clad disposed at a first corner, a second dummy clad disposed at a second corner, a third dummy clad disposed at a fourth corner, and a fourth dummy clad disposed at a third corner, the first dummy clad and the third dummy clad may have an equal width, and the second dummy clad and the fourth dummy clad may have an equal width.

A width of the first dummy clad may be a half of a maximum width of the waveguide, and a width of the second dummy clad may be a half of a minimum width of the waveguide.

The optical waveguide may include a first optical waveguide and a second optical waveguide which surrounds the first optical waveguide.

The second clad layer may be formed to have a width that decreases in a direction.

According to another aspect of the present disclosure, a method for manufacturing a laser element includes forming a first optical waveguide on a first clad layer, forming a second optical waveguide on the first clad layer, forming a second clad layer on the first optical waveguide and the second optical waveguide, dividing the second clad layer into a plurality of second clad layers by etching the second clad layer, and performing cutting into a plurality of chips, in which the forming of the second optical waveguide includes dividing the first optical waveguide into a plurality of first optical waveguides by etching the first optical waveguide, and forming the second optical waveguide in an area where the first optical waveguide is etched, the plurality of first optical waveguides being disposed alternately in a first direction.

The dividing into the plurality of second clad layers may include dividing the second clad layer into the plurality of second clad layers by etching the second clad layer, the plurality of second clad layers being disposed on the plurality of first optical waveguides, respectively.

The plurality of second clad layers may be disposed alternately in a longitudinal direction.

The plurality of second clad layers may be disposed in a plurality of chip-unit regions, respectively, and both ends of the second clad layer may extend to an outside of the chip-unit region.

In the performing of cutting into the plurality of chips, a chip may be separated such that both ends of the plurality of second clad layers are partially cut in performing cutting in a direction perpendicular to the longitudinal direction of the second clad layer.

The forming of the plurality of second clad layers may include forming the plurality of second clad layers such that a width of an end of the second clad layer decreases.

Advantageous Effects

According to an embodiment, uniformity in regrowth thickness and composition of a passive optical waveguide may be improved. Thus, reflection and light-emission performance of a light-emitting surface AR and a light-reflecting surface HR may be enhanced.

Moreover, even when an error occurs at a cutting position in chip separation, a yield may be maintained.

In addition, in application of various chip structures such as a spot size converter (SSC) structure, a yield may be maintained.

Furthermore, a coupling loss may be reduced.

Various and useful advantages and effects of the present disclosure are not limited to the foregoing description, and may be more easily understood in the course of describing detailed embodiments of the present disclosure.

BRIEF DESCRIPTION OF DRAWINGS

FIG. 1 shows a plane view and a cross-sectional view of a conventional laser element manufacturing process.

FIG. 2A is a plane view showing another conventional laser element manufacturing process.

FIG. 2B is a view showing that a chip is cut at a position X1 due to a process error.

FIG. 2C is a view showing that a chip is cut at a position X2 due to a process error.

FIG. 3 is a conceptual view of a laser element according to an embodiment of the present disclosure.

FIG. 4 is a perspective view of a laser element according to an embodiment of the present disclosure.

FIG. 5 is a plane view of FIG. 4.

FIG. 6 is a conceptual view of a laser element according to another embodiment of the present disclosure.

FIGS. 7 through 15 are views showing a method for manufacturing a laser element according to an embodiment of the present disclosure.

FIG. 16 is a plane view showing a state in which a plurality of chip-unit regions are divided on a substrate in a method for manufacturing a laser element according to an embodiment of the present disclosure.

FIG. 17 is a plane view of a cut chip.

FIG. 18 is a plane view showing a state in which a plurality of chip-unit regions are divided on a substrate in a method for manufacturing a laser element according to another embodiment of the present disclosure.

FIG. 19 is a plane view of a cut chip.

FIG. 20 is a plane view showing a state in which a plurality of chip-unit regions are divided on a substrate in a method for manufacturing a laser element according to still another embodiment of the present disclosure.

FIG. 21 is a plane view of a cut chip.

FIG. 22 is a plane view showing a state in which a plurality of chip-unit regions are divided on a substrate in a method for manufacturing a laser element according to yet another embodiment of the present disclosure.

FIG. 23 is a plane view of a cut chip.

BEST MODE

Current embodiments may be modified into other forms or several thereof may be combined, and the scope of the present disclosure is not limited to each embodiment described below.

Even when details described in a particular embodiment are not described in another embodiment, the description of those details may be understood as a description related to the other embodiment, unless there is a description that is opposite or contradictory to the details in the other embodiment.

For example, when characteristics of a component A are described in a particular embodiment and characteristics of a component B are described in another embodiment, an embodiment where the component A and the component B are combined with each other, though not described apparently, should be understood as falling within the scope of the present disclosure, unless there is an opposite or contradictory description.

In a description of an embodiment, when it is described that any one element is formed "on or under" another element, "on or under" may include that two elements directly contact each other or one or more other elements are formed indirectly by being disposed between the two elements. The expression "on or under" may include a meaning of a downward direction as well as a meaning of an upward direction, with respect to one element.

Hereinafter, an embodiment of the present disclosure will be described in detail with reference to the attached drawings to allow those of ordinary skill in the art to easily carry out the embodiment of the present disclosure.

FIG. 3 is a conceptual view of a laser element according to an embodiment of the present disclosure, FIG. 4 is a plane view of FIG. 3, and FIG. 5 is a conceptual view of a laser element according to another embodiment of the present disclosure.

Referring to FIG. 3, a laser element according to an embodiment may include a first clad layer 121, an optical waveguide 140, a second clad layer 150, and a first electrode 170.

The laser element may include an active region 10 and a passive region 20. The optical waveguide may include a first optical waveguide (active optical waveguide) S1 disposed in the active region 10 and a second optical waveguide (passive optical waveguide) 140 disposed in the passive region. The first optical waveguide S1 and the second optical waveguide 140 may be optically connected to each other. For example, the first optical waveguide S1 and the second optical waveguide 140 may be coupled to each other in a butt-joint manner.

The first optical waveguide S1 may include an active layer 123. The active layer 123 may have a multi-quantum well (MQW) structure where a well layer and a barrier layer are stacked alternately. Compositions of the well layer and the barrier layer may include InAlGaAs or InGaAsP, without being necessarily limited thereto.

A first separated confinement heterostructure (SCH) layer 122 may be an optical guide layer for guiding oscillation of a laser beam and may be formed of, for example, undoped InAlGaAs or InGaAsP, on the first clad layer 121.

A second SCH layer 124 may be an optical guide layer for guiding oscillation of a laser beam and may be formed of, for example, undoped InAlGaAs or InGaAsP, on the active layer 123.

The first SCH layer 122 and the second SCH layer 124 may have a smaller band gap than the first clad layer 121 and the second clad layer 150, and the well layer may have a smaller band gap than the first SCH layer 123 and the second SCH layer 124. Thus, electrons and holes injected through the first clad layer 121 and the second clad layer 150 may be captured in a quantum well to provide an optical gain.

The first optical waveguide S1 and the second optical waveguide 140 may be disposed between the first clad layer 121 and the second clad layer 150. The first clad layer 121 and the second clad layer 150 may include, but not necessarily limited to, InP or InGaAsP.

A grating 131 may be disposed between the second clad layer 150 and the second SCH layer 124. The grating 131 selects and reflects a single wavelength, enabling single-mode laser output. However, without being necessarily limited thereto, the grating may be disposed under the first SCH layer 122.

An ohmic electrode layer 160 and the first electrode 170 may be disposed on the second clad layer 150. The second electrode 126 may be disposed under a substrate 110.

Referring to FIGS. 4 and 5, the laser element according to an embodiment may include the second clad layer 150 in the shape of a strip. A waveguide mode occurs in a region where the optical waveguide overlaps the first and second clad layers, such that the shape of the second clad layer 150 may correspond to an optical waveguide mode region.

The second clad layer 150 may include a first sub clad layer 151 disposed on the active layer 123 and a second sub clad layer 152 disposed on a regrown passive region. An end 152a of the second sub clad layer 152 may be formed with a width that decreases toward the front to have an SSC structure. With such a structure, the size of the laser beam to be output may be adjusted.

According to an embodiment, the laser element may include dummy clads 154 and 153 disposed apart from the second clad layer 150 and the first electrode 170. The dummy clads 154 and 153 may have the same composition as the second clad layer 150. For example, the dummy clads 154 and 153 and the second clad layer 150 may include InP or InGaAsP.

The dummy clads 154 and 153 may include a first dummy clad 154 and a second dummy clad 153. The first dummy clad 154 may be disposed at a side of the first electrode 170, and the second dummy clad 153 may be disposed at the other side of the first electrode 170. That is, the first electrode 170 may be disposed between the first dummy clad 154 and the second dummy clad 153. However, without being necessarily limited thereto, the first electrode 170 may not be disposed between the first dummy clad 154 and the second dummy clad 153. Only any one of the first dummy clad 154 and the second dummy clad 153 may exist in the laser element.

The second clad layer 150, the first dummy clad 154, and the second dummy clad 153 may have the same thickness. This is because the second clad layer 150, the first dummy clad 154, and the second dummy clad 153 are grown through the same process and are separated by etching.

The area of the first dummy clad 154 may be different from that of the second dummy clad 153. For example, the area of the first dummy clad 154 may be greater than that of the second dummy clad 153. According to such a structure, even when a cutting position of a chip changes due to a process error, a desired SSC width may be maintained, thus improving a yield. A detailed description will be made later.

A width W11 of the first dummy clad 154 may be equal to a maximum width W3 of the second clad layer 150, and a width W21 of the second dummy clad 153 may be equal to a minimum width W4 of the second clad layer 150. The minimum width W4 of the second clad layer 150 may be less than the maximum width W3 of the second clad layer 150 to adjust the size of the laser beam. Herein, the width may be a vertical length in FIG. 5.

A length W12 of the first dummy clad 154 may be equal to a length W22 of the second dummy clad 153, without being necessarily limited thereto. For example, the length W12 of the first dummy clad 154 may be greater or less than the length W22 of the second dummy clad 153. Herein, the length may be a horizontal length in FIG. 5.

Referring to FIG. 6, a dummy clad may include a first dummy clad 154a disposed at a first corner, a second dummy clad 153a disposed at a second corner, a third dummy clad 154a disposed at a fourth corner, and a fourth dummy clad 153a disposed at a third corner.

The first dummy clad 154a and the third dummy clad 154a may have the same width, and the second clad 153a and the fourth dummy clad 153a may have the same width.

The width of the first dummy clad 154a may be a half of the width of the other end 152b of the second clad layer 150, and the width of the second dummy clad 153a may be a half of the width of one end 152a of the second clad layer 150. However, the present disclosure is not necessarily limited thereto. That is, the width may be greater or less than the half.

FIGS. 7 through 15 are views showing a method for manufacturing a laser element according to an embodiment of the present disclosure, FIG. 16 is a plane view showing a state where a plurality of chip regions are divided on a substrate, in a method for manufacturing a laser element according to an embodiment of the present disclosure, and FIG. 17 is a plane view of a cut chip.

Referring to FIG. 7, the first clad layer 121, the first SCH layer 122, the active layer 123, the second SCH layer 124, and a grating layer 130 may be sequentially formed on the substrate 110. A buffer layer may be further formed between the substrate 110 and the first clad layer 121, without being necessarily limited thereto.

The active layer 123 may have an MQW structure where a well layer and a barrier layer are stacked alternately. Compositions of the well layer and the barrier layer may include, but not necessarily limited to, InAlGaAs or InGaAsP.

The first SCH layer 122 may be an optical guide layer for guiding oscillation of a laser beam and may be formed of, for example, undoped InAlGaAs or InGaAsP, on the first clad layer 121.

The second SCH layer 124 may be an optical guide layer for guiding oscillation of a laser beam and may be formed of, for example, undoped InAlGaAs or InGaAsP, on the active layer 123.

The first SCH layer 122 and the second SCH layer 124 may have a smaller band gap than the first clad layer 121 and the second clad layer 150, and the well layer may have a smaller band gap than the first SCH layer 123 and the second SCH layer 124. Thus, electrons and holes injected through the first clad layer 121 and the second clad layer 150 may be captured in a quantum well to provide an optical gain.

Referring to FIG. 8, the grating layer 130 may be patterned to form a plurality of gratings 131. The plurality of gratings 131 may select and reflect a single wavelength, enabling single-mode laser output. However, without being necessarily limited thereto, the grating 131 may be disposed under the first clad layer 121.

Referring to FIG. 9, a mask 132 may be formed on the plurality of gratings 131. The mask 132 may include, but not necessarily limited to, SiO2 or SiNx. The mask 132 may have, but not necessarily limited to, the shape of a parallelogram with both inclined surfaces.

Referring to FIG. 10, the first optical waveguide S1 may be partially etched WE1. Thus, only a region of the first optical waveguide S1, which is under the mask 132, may remain. Hence, both surfaces S11 and S12 of the first optical waveguide S1 may be inclined according to the shape of the mask 132.

Referring to FIG. 11, the second optical waveguide 140 may be formed in a region from which the first optical waveguide S1 is removed. The second optical waveguide 140 may be formed to globally surround the first optical waveguide S1 having the shape of a rectangular. The second optical waveguide 140 may have an energy band gap smaller than the clad layer. For example, the composition of the second optical waveguide 140 may include, but not necessarily limited to, InGaAsP.

Referring to FIG. 12, the second clad layer 150 may be formed on the first optical waveguide S1 and the second optical waveguide 140. The ohmic electrode layer 160 may be formed on the second clad layer 150.

Referring to FIG. 13, the second clad layer 150 may be etched. In this case, a cross section of the remaining second clad layer 150 may have a vertical shape that is a rectangular shape. However, without being necessarily limited thereto, the cross section may have the shape of a ridge with a width that decreases toward a lower portion thereof. When the cross section of the second clad layer 150 has the shape of a ridge, the dummy clad may also have the shape of a ridge.

The width of the first sub clad layer 151 of the second clad layer 150 is constant, whereas the second sub clad layer 152 may have an SSC structure with a width that gradually decreases toward a light-emitting surface.

FIG. 13 shows a structure where the second optical waveguide 140 is exposed by globally etching the second clad layer 150, but without being necessarily limited thereto, the structure may be a buried heterodyne (BH) structure where both sides of the second clad layer 150 are regrown after the second clad layer 150 is etched.

Referring to FIGS. 14 and 15, a planarization layer 180 and a protection layer 171 may be formed in a region from which the second clad layer 150 is etched, and the first electrode 170 contacting the ohmic electrode layer 160 may be formed. The protection layer 171 may be disposed on the first optical waveguide and the second optical waveguide which are exposed by etching of the second clad layer 150. The protection layer 171 may be disposed on the dummy clad.

Referring to FIG. 16, a method for manufacturing a laser element according to an embodiment may form an epi and an electrode on one wafer substrate and then separate the wafer substrate into a plurality of chip-unit regions 11 through 22. That is, as described with reference to FIGS. 7 through 11, a first clad layer, a first optical waveguide, and a second optical waveguide may be sequentially formed on the wafer substrate.

A plurality of first optical waveguides S1 divided by etching (see FIG. 10) may be disposed alternately with one another in a first direction (a Y-axis direction). For example, the first optical waveguide S1 disposed in a first chip-unit region 11 may be disposed alternately with the first optical waveguide S1 disposed in a third chip-unit region 13 in the first direction (the Y-axis direction). In addition, the first optical waveguide S1 disposed in the first chip-unit region 11 may be disposed to face the first optical waveguide S1 disposed in a sixth chip-unit region 16. That is, the plurality of first optical waveguides S1 may be disposed in zigzags in the first direction.

A first region L1 between the first optical waveguide S1 disposed in the first chip-unit region 11 and the first optical waveguide S1 disposed in the sixth chip-unit region 16 may have the same distance as a second region L2 between the first optical waveguide S1 disposed in the sixth chip-unit region 16 and the first optical waveguide S1 disposed in a twentieth chip-unit region 21. Thus, an interval between the first optical waveguides S1 facing each other in the first direction (the Y-axis direction) may be identical.

The first region L1 and the second region L2 may be regions where the second optical waveguide is regrown. Thus, as the areas of the regions where the second optical waveguide is regrown are equal to each other, thickness and composition may become uniform.

Referring to FIG. 17, in the sixth chip-unit region 16, composition and thickness of a passive optical waveguide 141 disposed in front of the first optical waveguide S1 may be the same as those of a passive optical waveguide 142 disposed at the rear of the first optical waveguide S1. Thus, qualities of a light-emitting surface AR and a light-reflecting surface HR disposed in a passive optical waveguide become uniform, improving reflection and light-emission performance.

Referring back to FIG. 16, the plurality of second clad layers 150 may be disposed apart respectively in the chip-unit regions 11 through 22 by mesa etching. The plurality of second clad layers 150 may be disposed to overlap the first optical waveguide S1.

The plurality of second clad layers 150 may be disposed apart from one another in the first direction (a longitudinal direction). That is, the plurality of second clad layers 150 may be disposed alternately with one another without continuing in the longitudinal direction. The structure in which the plurality of second clad layers 150 are disposed alternately in the first direction (the Y-axis direction) may be the same as the structure of the first optical waveguide S1.

In this case, the second clad layer 150 may be formed longer than the length of a chip-unit region in the longitudinal direction. For example, an end 153 of the second clad layer 150 disposed in the sixth chip-unit region 16 may be formed long to extend to an eighth chip-unit region 18, and the other end 154 of the second clad layer 150 disposed in the sixth chip-unit region 16 may be formed long to extend to the third chip-unit region 13. With this structure, a desired width may be maintained even when the second clad layer 150 is cut short or long due to a tolerance, thereby preventing reduction of a yield.

In a chip cutting process, the chip may be primarily cut along second-direction cutting lines C1, C2, C11 and C12, and secondarily cut along first-direction cutting lines C3 through C8, allowing chip-unit separation. In this case, even when cutting deviates from the second-direction cutting lines C1, C2, C11, and C12 due to a tolerance, both ends of the second clad layer 150 extend beyond the chip-unit regions 11 through 17, such that the width of the second clad layer 150 may be maintained, increasing a yield. Therefore, when the chips are all separated, remainders 153 and 154 of the adjacent second clad layer 150 may exist in a chip as shown in FIG. 17.

FIG. 18 is a plane view showing a state in which a plurality of chip regions are divided on a substrate in a method for manufacturing a laser element according to another embodiment of the present disclosure, and FIG. 19 is a plane view of a cut chip.

The first optical waveguide S1 and the second clad layer 150 are disposed alternately with each other as described above, but in FIG. 18, two adjacent second clad layers 150 may be disposed to overlap each other in one chip-unit region. Thus, by cutting the chip as shown in FIG. 19, the dummy clads 153a and 154a may be formed in each of four corners.

More specifically, the dummy clads 153a and 154a may include a first dummy clad 154a disposed at a first corner VX1, a second dummy clad 153a disposed at a second corner VX2, a third dummy clad 154a disposed at a fourth corner VX4, and a fourth dummy clad 153a disposed at a third corner VX3.

The first dummy clad 154a and the third dummy clad 154a may have the same width, and the second clad 153a and the fourth dummy clad 153a may have the same width.

The width of the first dummy clad 154a may be a half of the width of the other end 152b of the second clad layer 150, and the width of the second dummy clad 153a may be a half of the width of one end 152a of the second clad layer 150.

FIG. 20 is a plane view showing a state in which a plurality of chip-unit regions are divided on a substrate in a method for manufacturing a laser element according to yet another embodiment of the present disclosure, and FIG. 21 is a plane view of a cut chip.

To the state where the plurality of chip regions are divided according to FIG. 20, the structure of FIG. 16 is applied, except that the plurality of clad layers 150 are disposed to face one another.

For example, the second clad layer 150 in the first chip-unit layer 11 and the second chip-unit region 12 may have an SSC structure 153 in the first direction, whereas the second clad layer 150 disposed in the third through fifth chip-unit regions 13, 14, and 15 may have the SSC structure 153 in a direction opposite to the first direction.

Therefore, as shown in FIG. 21, the width of the dummy clad 153 connected with the light-emitting surface AR may be smaller than that of the dummy clad 154 connected with the light-reflecting surface HR.

FIG. 22 is a plane view showing a state in which a plurality of chip-unit regions are divided on a substrate in a method for manufacturing a laser element according to yet another embodiment of the present disclosure, and FIG. 23 is a plane view of a cut chip.

To the state where the plurality of chip regions are divided according to FIG. 22, the structure of FIG. 18 is applied, except that the plurality of clad layers 150 are disposed to face one another. For example, the second clad layer 150 in the first chip-unit layer 11 and the second chip-unit region 12 may have an SSC structure in the first direction, whereas the second clad layer 150 disposed in the third through fifth chip-unit regions 13, 14, and 15 may have the SSC structure 153 in the direction opposite to the first direction.

Therefore, as shown in FIG. 23, the width of the dummy clads 153a connected with the light-emitting surface AR may be smaller than that of the dummy clads 154a connected with the light-reflecting surface HR.

While the embodiments have been described above, they are merely examples and do not limit the present disclosure, and it would be understood by those of ordinary skill in the art that several modifications and applications not described above are possible without departing from the essential characteristics of the current embodiment. For example, each component described in detail in the embodiment may be carried out by being modified. Differences related to such modifications and applications should be interpreted as falling within the scope of the present disclosure defined in the appended claims.

The invention claimed is:
1. A laser element comprising:
a first clad layer;
an optical waveguide disposed on the first clad layer;
a second clad layer disposed on the optical waveguide;
a first electrode disposed on the second clad layer; and
a dummy clad disposed on the optical waveguide and apart from the second clad layer and the first electrode,
wherein the dummy clad comprises: a first dummy clad disposed at a first corner, a second dummy clad disposed at a second corner, a third dummy clad disposed at a fourth corner, and a fourth dummy clad disposed at a third corner, the first dummy and the third dummy clad having an equal width, and the second dummy clad and the fourth dummy clad having an equal width.

2. The laser element of claim 1, wherein the dummy clad comprises a first dummy clad and a second dummy clad, and an area of the first dummy clad is larger than an area of the second dummy clad.

3. The laser element of claim 2, wherein a thickness of the second clad layer, a thickness of the first dummy clad, and a thickness of the second dummy clad are equal to one another.

4. The laser element of claim 2, wherein a length of the first dummy clad is equal to a length of the second dummy clad.

5. The laser element of claim 2, wherein the first electrode is disposed between the first dummy clad and the second dummy clad.

6. The laser element of claim 2, wherein compositions of the first dummy clad and the second dummy clad are the same as a composition of the second clad layer.

7. The laser element of claim 2, wherein a width the first dummy clad is equal to a maximum width of the second clad layer, and a width of the second dummy clad is equal to a minimum width of the second clad layer.

8. The laser element of claim 1, wherein a width of the first dummy clad is a half of a maximum width of the optical waveguide, and a width of the second dummy clad is a half of a maximum width of the optical waveguide.

9. The laser element of claim 1, wherein the optical waveguide comprises a first optical waveguide and a second optical waveguide which surrounds the first optical waveguide.

10. The laser element of claim 1, wherein the second clad layer is formed to have a width that decreases in a direction.

11. A method for manufacturing a laser element, the method comprising:
   forming a first optical waveguide on a first clad layer;
   forming a second optical waveguide on the first clad layer;
   forming a second clad layer on the first optical waveguide and the second optical waveguide;
   dividing the second clad layer into a plurality of second clad layers by etching the second clad layer; and
   performing cutting into a plurality of chips,
   wherein the forming of the second optical waveguide comprises dividing the first optical waveguide into a plurality of first optical waveguides by etching the first optical waveguide into a plurality of first optical waveguides by etching the first optical waveguide, and forming the second optical waveguide in an area where the first optical waveguide is etched, the plurality of first optical waveguides being disposed alternately in a first direction.

12. The method of claim 11, wherein the dividing into the plurality of second clad layers comprises dividing the second clad layer into the plurality of second clad layers by etching the second clad layer, the plurality of second clad layers being disposed on the plurality of first optical waveguides, respectively.

13. The method of claim 12, wherein the plurality of second clad layers are disposed alternately in a longitudinal direction.

14. The method of claim 12, wherein the plurality of second clad layers are disposed in a plurality of chip-unit regions, respectively, and both ends of the second clad layer extend to an outside of the chip-unit region.

15. The method of claim 12, wherein in the performing of cutting into the plurality of chips, a chip is separated such that both ends of the plurality of second clad layers are partially cut in performing cutting in a direction perpendicular to the longitudinal direction of the second clad layer.

16. The method of claim 11, wherein the forming of the plurality of second clad layers comprises forming the plurality of second clad layers such that a width of an end of the second clad layer decreases.

* * * * *